US009625614B2

United States Patent
Rikoski (10) Patent No.: US 9,625,614 B2
(45) Date of Patent: Apr. 18, 2017

(54) SYSTEMS AND METHODS FOR ATMOSPHERIC MODELING BASED ON GPS MEASUREMENT

(71) Applicant: Hadal, Inc., Alameda, CA (US)

(72) Inventor: Richard J. Rikoski, Alameda, CA (US)

(73) Assignee: HADAL, INC., Alameda, CA (US)

( * ) Notice: Subject to any disclaimer, the term of this patent is extended or adjusted under 35 U.S.C. 154(b) by 531 days.

(21) Appl. No.: 13/909,459

(22) Filed: Jun. 4, 2013

(65) Prior Publication Data

US 2013/0325425 A1 Dec. 5, 2013

Related U.S. Application Data

(60) Provisional application No. 61/655,184, filed on Jun. 4, 2012.

(51) Int. Cl.
*G06G 7/50* (2006.01)
*G01W 1/00* (2006.01)
*G06F 17/50* (2006.01)

(52) U.S. Cl.
CPC ............ *G01W 1/00* (2013.01); *G06F 17/50* (2013.01); *G01W 2001/006* (2013.01)

(58) Field of Classification Search
CPC ... G01W 1/10; G01W 2001/006; G01W 1/02; G01W 1/14; G01W 1/00; G06F 17/50
USPC ...................................................... 703/9, 6
See application file for complete search history.

(56) References Cited

U.S. PATENT DOCUMENTS 6,067,852 A * 5/2000 Alber .................. G01S 19/41
73/178 R

OTHER PUBLICATIONS

Misra, Pratap et al., "GPS Performance in Navigation", Jan. 1999, PRoceedings of the IEEE, vol. 87, No. 1, IEEE.*
Schreiner, William S. et al., "Precise GPS Data Processing for the GPS/MET Radio Occultation Mission at UCAR", Jan. 1998, Proceedings of the National Technical Meeting, Institute of Navigation.*
Grejner-Brzezinska et al., "GPS Error Modeling and OTF Ambiguity Resolution for High-Accuracy GPS/INS Integrated System", 1998, Journal of Geodesy, 72, Springer-Verlag.*

(Continued)

*Primary Examiner* — Cedric D Johnson
(74) *Attorney, Agent, or Firm* — White & Case LLP (57) ABSTRACT

Systems and methods described herein include improved data gathering, climate modeling and weather forecasting techniques. In particular, the systems include using Global Positioning System (GPS) measurements obtained from a network of GPS devices for simultaneously determining atmospheric parameters such as water vapor content, temperature and pressure, and correcting for errors in the GPS measurements, themselves. The systems and methods described herein include a central processor for receiving data from a plurality of GPS devices and updating a computerized climate or weather forecasting model. Advantageously, by using data from a plurality, and in some embodiments a very large number of GPS devices, the systems and methods described herein may solve for both propagation velocity of electromagnetic signals through the atmosphere (used for calculating atmospheric parameters useful in climate modeling) and GPS position error values (used for error correction at each GPS device).

9 Claims, 7 Drawing Sheets

(56) References Cited

OTHER PUBLICATIONS

Yanmeng Bi et al., "Preliminary Results of 4-D Water Vapor Tomography in the Troposphere Using GPS", 2006, Advances in Atmospheric Sciences, vol. 23, No. 4.*
Sturdevant, Rick W., "The Socioeconomic Impact of the NAVSTAR Global Positioning System, 1989-2009", Sep. 14-17, 2009, AIAA Space 2009 Conference and Exposition, American Institute of Aeronautics and Astronautics.*
Doin, M. P. et al., "Corrections of Stratisfied Tropospheric Delays in SAR Interferometry: Validation with Global Atmospheric Models"), 2009, Journal of Applied Geophysics 69, Elsevier B.V.*
Mosavi, M.R., "Frequency Domain Modeling of GPS Positioning Errors", 2006, ICSP 2006 Proceedings, IEEE.*
Raju, P. L. N., "Fundamentals of GPS", Jul., 2003, Satellite Remote Sensing and GIS Applications in Agricultural Meteorology.*

\* cited by examiner

SYSTEMS AND METHODS FOR ATMOSPHERIC MODELING BASED ON GPS MEASUREMENT

CROSS-REFERENCE TO RELATED APPLICATIONS

This application claims the benefit of U.S. Provisional Application Ser. No. 61/655,184, filed Jun. 4, 2012, the contents of which are incorporated by reference herein in their entireties.

BACKGROUND

Current weather prediction and climate modeling systems, now largely computer-based, rely on measuring changes in atmospheric pressure, temperature, and humidity over time. By monitoring changes in these parameters over an extended period the trends can be used by computer models to make predictions regarding the short term individual weather events and patterns of a few days or so. Longer timescale predictions are typically made possible by aspects of the climate system which vary on timescales which are longer than individual weather events. For example, the El Nino Southern Oscillation (ENSO) varies on timescales from seasons to years and involves atmospheric changes over the earth's and ocean's surface.

Some current methods for forecasting use coupled atmosphere-ocean global circulation computer models (AOGCM) that solve the physical equations of the system and represent the complex interactions between all aspects of the climate system. Generally, observations or measurements of the current state of the climate system are acquired, and these are input into the model to produce a best estimate of its current state. The model is then run forward in time to produce the forecast. Rather than running the model once, from a single initial state, a range of different initial states is used so that a number of forecasts are produced which are hoped to span the range of future weather states consistent with current information.

These models typically use atmospheric measurements including those obtained from satellite imagery, weather balloons, weather stations, and visual confirmation. Satellites orbit thousands of miles above the earth, weather balloons are infrequent and subject to random movement, weather stations are spread sometimes miles apart, and visual confirmation can only inform that the weather being reported is, in fact occurring.

Accordingly, there is a need for improved climate modeling and weather forecasting systems and methods.

SUMMARY

Systems and methods described herein include improved data gathering, climate modeling and weather forecasting techniques. In particular, the systems include using Global Positioning System (GPS) measurements obtained from a network of GPS devices for determining atmospheric parameters such as water vapor content, temperature and pressure, and simultaneously correcting for errors in the GPS measurements, themselves. The systems and methods described herein include a central processor for receiving data from a plurality of GPS devices and updating a computerized climate or weather forecasting model. Advantageously, by using data from a plurality, and in some embodiments a very large number of GPS devices, the systems and methods described herein may solve for both propagation velocity of electromagnetic signals through the atmosphere (which can be used for calculating atmospheric parameters useful in climate modeling) and GPS position error values (which is useful for correcting and fine tuning the error measurements at one or more individual GPS devices).

Although the systems and methods are described herein with respect to GPS, it is understood that the present disclosure may be used with any suitable Global Navigation Satellite System (GNSS). Generally, GNSS systems include the Global Positioning System (GPS), owned and operated by the United States, the Russian Global Navigation Satellite System (GLONASS), the European Satellite Navigation System (Galileo), and Immarsat. More than 50 GNSS satellites are in currently in orbit, emitting microwave signals with well-characterized complex signals (mostly in L band), providing a very powerful infrastructure for planetary observation. For the purpose of simplicity, the present disclosure uses the term GPS to refer to any suitable signals obtained from satellites including any type of GNSS signal. It is expected that such systems will some day be operational in other planets as well, and the systems and methods described herein may apply to extra-terrestrial atmospheric modeling.

In one aspect, the systems and methods described herein include computerized methods for modeling atmospheric properties. The methods may include receiving, at a central processor, data from a plurality of Global Positioning System (GPS)-enabled devices, and access to one or more computer-based atmospheric models representative of atmospheric parameters including water vapor content. The methods may further include simultaneously estimating, at the central processor, a propagation velocity of one or more signals received at each of the GPS-enabled devices from one or more GPS satellites, and a position error value for each of the GPS-enabled devices. The central processor may simultaneously estimates the propagation velocity and the position error value by iteratively updating the one or more atmospheric models using the data from the plurality of GPS-enabled devices. In certain embodiments, the data received from the plurality of GPS-enabled devices include at least one of pseudo-range values, pseudo-range residuals, pseudo-range rates, position value, and position error value. The central processor may include at least one of a Kalman filter and a sparse information filter for simultaneously estimating the propagation velocity and the position error value. The methods may further include transmitting the estimated position error value to the plurality of GPS-enabled devices In certain embodiments, the plurality GPS-enabled devices (e.g., greater than one million devices, and in some cases greater than 10 million) include GPS-enabled devices selected from group consisting of portable electronic devices, smart phones, ocean buoys, ships, and aircraft. The central processor may be configured to simultaneously estimate one or more propagation velocities across an atmospheric volume of at least 1011 km3. The central processor may computationally divide up the atmospheric volume into voxels (volume pixels) having dimension of about 10 km, and the central processor may simultaneously estimate propagation velocities within each of the voxels. In certain embodiments, the central processor is configured to simultaneously estimate one or more propagation velocities across an atmospheric volume covering a city area of 104 km2 and a vertical distance of about 1000 km. Generally, computationally, the central processor may divide up the atmospheric volume into a plurality of voxels and the central processor may simultaneously estimate propagation velocities within each of the voxels.

BRIEF DESCRIPTION OF THE DRAWINGS

The foregoing and other objects and advantages of the disclosure will be appreciated more fully from the following further description thereof, with reference to the accompanying drawings, wherein.

DETAIL DESCRIPTION

To provide an overall understanding of the systems and methods described herein, certain illustrative embodiments will now be described, including systems and methods for tomographic analysis of GPS measurements. However, it will be understood by one of ordinary skill in the art that the systems and methods described herein may be adapted and modified for other suitable applications and that such other additions and modifications will not depart from the scope thereof.

Figure 1:
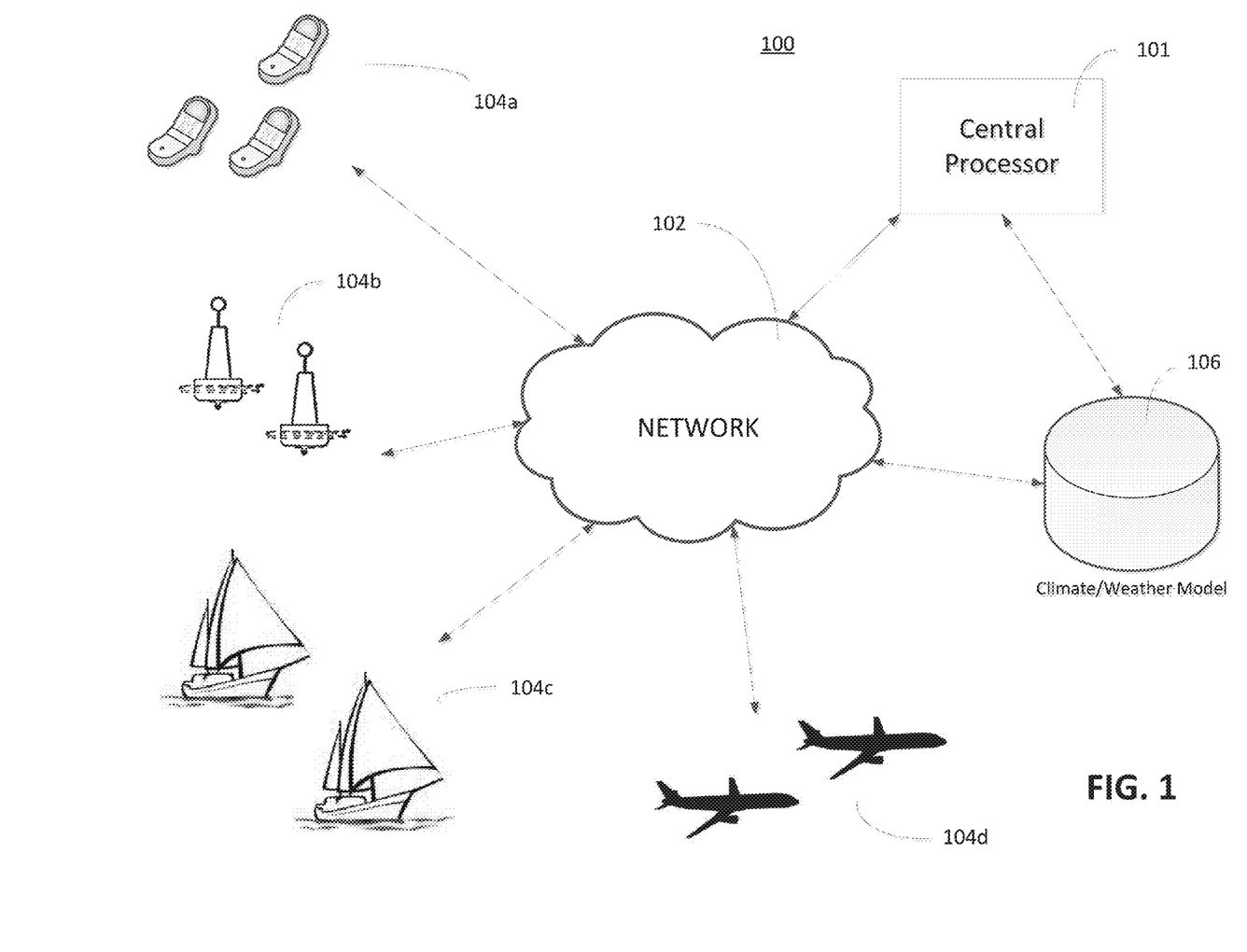
FIG. 1 depicts an overview of the atmospheric modeling and GPS correction system, according to an illustrative embodiment of the disclosure.

FIG. 1 depicts an overview of the atmospheric modeling and GPS correction system 100, according to an illustrative embodiment of the disclosure. In particular, the atmospheric modeling and GPS correction system includes a central processor 101 configured to receive GPS measurements from a plurality of GPS-enabled devices via network 102. The GPS-enabled devices (collectively, "104") may be distributed across land, sea, air and space. On land, the GPS-enabled devices may include portable electronic device or mobile devices 104a such as cellphones or smartphones having GPS capabilities that are distributed across the world, sport and vehicle GPS navigation devices, stationary GPS towers, cell phone towers, and the like. Over water, GPS devices may include one or more buoys 104b distributed across the world's oceans, boats and ships 104c and other vehicles over and under water including submarines. Sea-based GPS-enabled devices may include cabled ocean observatories, and other underwater stations. In the air, the GPS-enabled devices may include any manner of aircraft 104d and weather balloons. In space, GPS devices may include one or more satellites, preferably in low earth orbit. Generally, the GPS-enabled device may be any suitable device having the ability to receive and process GPS signals from one or more GPS satellites. In certain embodiments, the GPS-enabled devices may be moving and as such may include suitable navigation processors for resolving its position and velocity. Data obtained from these GPS-enabled devices may be processed at the central processor 101, which in turn uses GPS signal data to update one or more atmospheric climate and weather models. The information obtained from the one or more climate and weather model 106 may be used to update the GPS position estimates at the GPS-enabled device. As noted earlier, GPS signals may include any suitable type of GNSS signal. Thus, GPS position estimates may include any suitable type of GNSS estimate. In certain embodiments the information obtained from the one or more climate and weather model 106 may be used to update the GNSS position estimates at a GNSS-enabled device. In certain embodiments, data from one type of GNSS device may be fused with data from another type of GNSS device. For example, GPS data may be combined or fused with GLONASS data without departing from the scope of the present disclosure. The central processor 101 may perform both calculations of climate/weather model estimates and GPS position error fixes simultaneously, as described herein.

Figure 2:
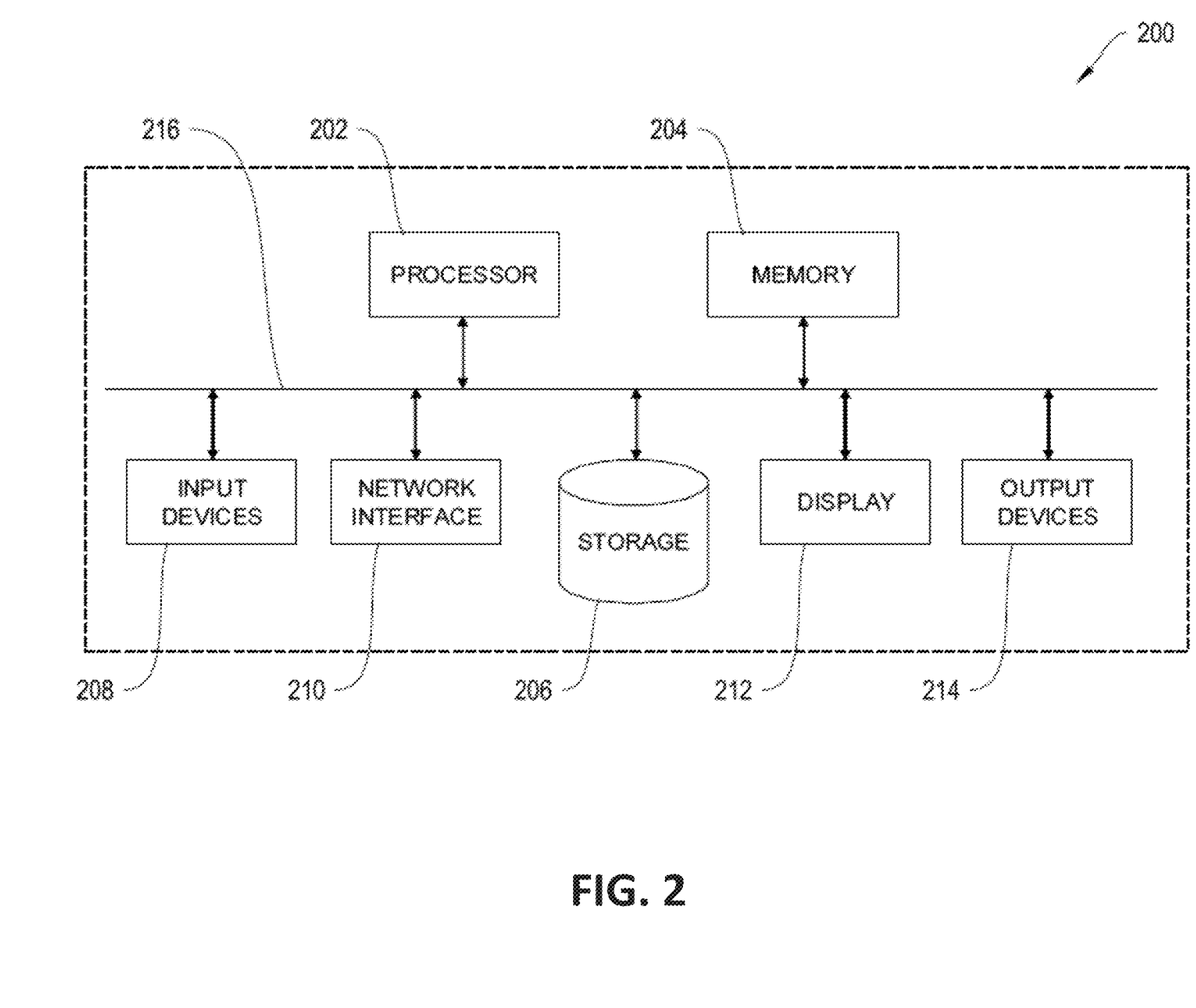
FIG. 2 depicts a block diagram for an illustrative computer-based system for executing atmospheric modeling and GPS error correction.

One or more components, in any suitable combination, of central processor 101 or any GPS-enabled device 104 or the climate model 106, or any other portion of system 100 may be implemented on one or more computer processing systems. FIG. 2 depicts a block diagram for an illustrative computer system 200 for executing atmospheric and GPS signal analysis. System 200 includes processor 202, memory 204, storage devices 206, input devices 208, network interface 210, display device 212, and output devices 214. The system components may be in communication via interconnect bus 216. Processor 202 may be from microprocessor series such as Intel Pentium, Intel Core, Intel Core 2, Intel Xeon, AMD Athlon, AMD Phenom, IBM Power, IBM PowerPC, or other such microprocessor series. Processor 202 may include a single microprocessor or a plurality of microprocessors for configuring system 200 as a multi-processor system. Memory 204 may include read-only (ROM) or random access (RAM) memories, such as a synchronous dynamic random access memory (SDRAM), capable of storing data as well as instructions to be executed by processor 202.

Storage 206 may include a hard disk drive (HDD), a tape drive, a flash drive, a floppy drive, a compact disc (CD), a digital versatile disc (DVD), or other suitable fixed or movable computer readable media, for storing data and instructions for use by the Processor 202. Input devices 208 may include a keyboard, a mouse, a trackball, or other suitable devices. Network interface 210 may include a network card, a modem, a serial port, a bus adapter, or any other suitable data communications device for communicating with one or more local or remote systems. System 200 may communicate over a network through the network interface 210. The network may be an optical network, a wired network, a wireless network (e.g., satellite or cellular network), or any other suitable type of network. Display 212 may include one or more liquid crystal display (LCD) or cathode ray tube (CRT) monitors, or other suitable devices. Output devices 214 may include a projector, a printer, speakers, or other such devices. A portion of the systems and methods described herein may be implemented by processor 202 in conjunction with other components of system 200.

Generally, the methods described herein may be executed on a conventional data processing platform such as an IBM PC-compatible computer running the Windows operating systems, a SUN workstation running a UNIX operating system or another equivalent personal computer or workstation. Alternatively, the data processing system may comprise a dedicated processing system that includes an embedded programmable data processing unit.

Certain of the processes described herein may also be realized as one or more software components operating on a conventional data processing system such as a UNIX workstation. In such embodiments, the processes may be implemented as a computer program written in any of several languages well-known to those of ordinary skill in the art, such as (but not limited to) C, C++, FORTRAN, Java or BASIC. The processes may also be executed on commonly available clusters of processors, such as Western Scientific Linux clusters, which may allow parallel execution of all or some of the steps in the process.

Certain of the methods described herein may be performed in either hardware, software, or any combination thereof. In particular, these methods may be carried out by software, firmware, or microcode operating on a computer or computers of any type, including pre-existing or already-installed image processing facilities capable of supporting any or all of the processor's functions. Additionally, software embodying these methods may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among devices connected to the Internet. Accordingly, these methods and systems are not limited to any particular platform, unless specifically stated otherwise in the present disclosure.

Figure 3:
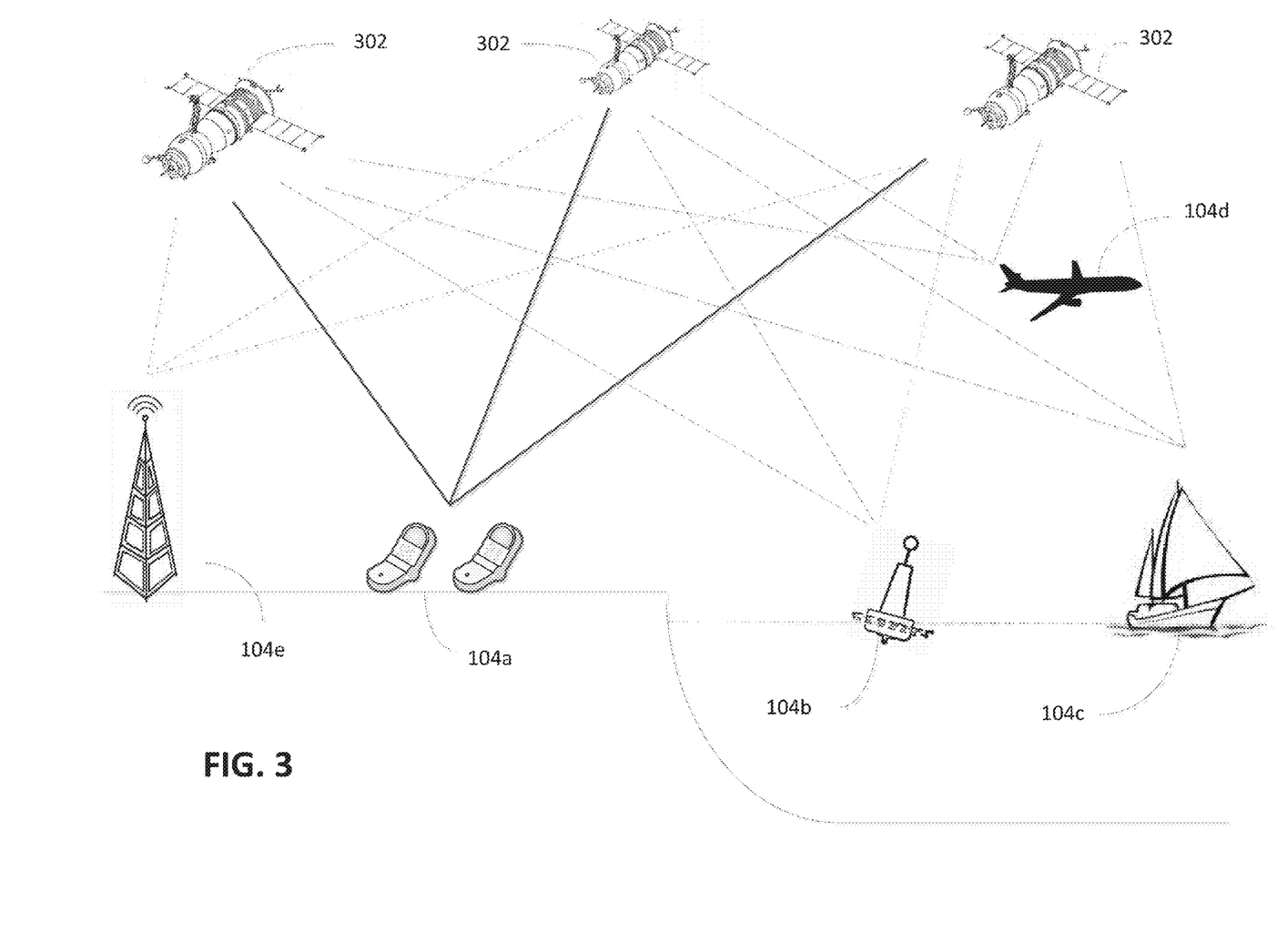
FIG. 3 depicts various GPS-enabled devices communicating with a plurality of satellites, according to an illustrative embodiment of the disclosure.

FIG. 3 depicts various GPS-enabled devices communicating with a plurality of satellites, according to an illustrative embodiment of the disclosure. GPS typically uses a constellation of satellites 302 in several circular orbits each containing four or more satellites to give an accurate position of a GPS-enabled device, such as GPS-enabled devices 104a, 104b, 104c, 104d, and 104e. Generally, to determine the position of a GPS-enabled device 104, measurements of distance between the GPS-enabled device and GPS satellites 302 are made at the device or receiver 104. In addition to the distance measurements, the time at which the GPS signals are transmitted from GPS satellite 302 are typically deduced from the distance measurements for correcting timing errors in the receiver 104.

During operation, generally each GPS satellite 302 transmits a low power microwave radio signal composed of two carrier frequencies, 1575.42 MHz and 1227.60 MHz. Embedded in these two carrier frequencies are a pseudo-range codes including a course acquisition code and a precision code. Pseudo-range values (i.e., the distance from the satellite to the receiver) are calculated based on the travel time of the signal, which can be determined by matching up the pseudo-range codes at the receiver with those obtained from the satellite. To determine position in three dimensions and time at the receiver, four satellites are generally used.

Figure 4:
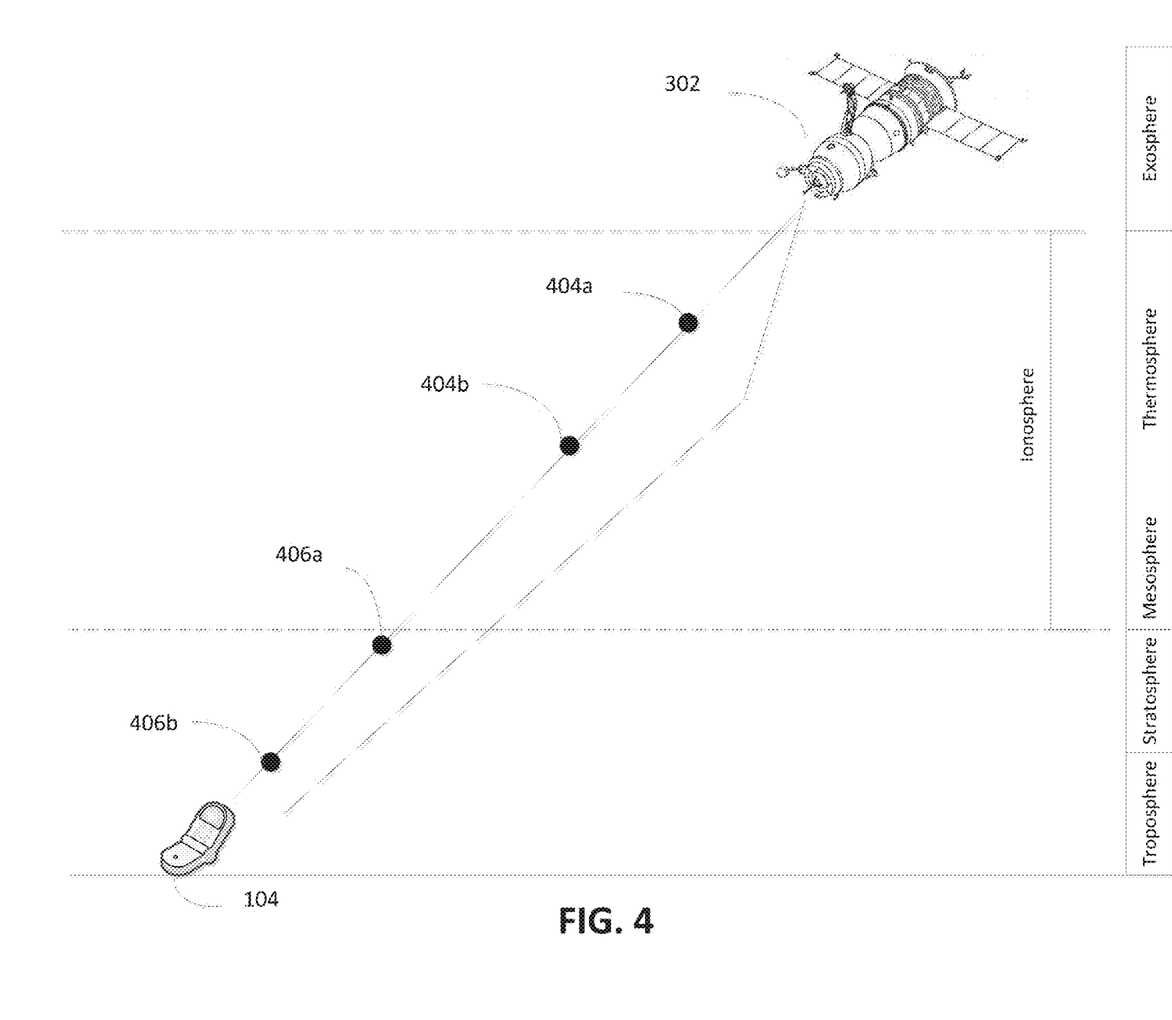
FIG. 4 depicts atmospheric delays encountered during typical GPS communications, according to an illustrative embodiment of the disclosure.

Not to be bound by theory, but GPS errors can arise from timing delays caused by satellite and receiver clock biases and atmospheric conditions. Specifically, the atmosphere causes the GPS radio signals to slow and bend, and this in turn causes errors in the GPS position estimates. FIG. 4 depicts atmospheric delays encountered during typical GPS communications, according to an illustrative embodiment of the disclosure. As shown in FIG. 4, the atmosphere between the GPS satellite 302 and GPS-enabled device 104 includes several layers. These layers include the troposphere extending to about 9-16 km about the surface, the stratosphere extending to about 50 km, the mesosphere extending to about 80 km and the thermosphere extending to about 500 km. These layers are normally divided up into the neutral atmosphere which comprises the troposphere and the stratosphere, and the ionosphere which comprises the mesosphere and the thermosphere. The ionosphere is composed of ions and free electrons. The delay of GPS signals in the ionosphere includes delays in the thermosphere 404a and delays caused by the mesosphere 404b. These delays are generally frequency dependent and proportional to the total electron content. In certain embodiments, errors due to these delays can be removed by combining two or more frequencies and using models for removing higher order effects.

Generally, neutral atmospheric delays are frequency independent and may be corrected using external information. The tropospheric delays are calculated based on the refractivity of the atmosphere, which in turn is dependent on total pressure, temperature and partial pressure due to water vapor content. The tropospheric delays are generally divided into a hydrostatic or dry part 406a and a wet part 406b. The large majority of the delay (typically about 90 percent) may be due to the dry component of the air (mainly nitrogen and oxygen). Because dry air is well mixed, variations in the dry delay mostly are slow and smooth. The refractivity of dry air is almost perfectly proportional to density. Therefore, under the assumption of hydrostatic equilibrium, the dry delay 406a may be derived from the surface pressure measurements.

The contribution to error from water vapor on average is less than that from the dry part. However, because the distribution of atmospheric water vapor is highly inhomogeneous, almost all the high-frequency temporal and spatial variability in the total tropospheric path delay at any site (or at any GPS-enabled device) is due to variations in wet delay. The systems and methods described herein may be used to correct for wet delays 406b at each GPS-enabled device while simultaneously updating a climate model, both of which are may be dependent on determining the water vapor content in the atmosphere.

Timing errors may be addressed by differential GPS (DGPS) technology, in which the correction information of the timing errors is provided from a stationary reference receiver, which uses its known position to calculate timing. This is a result of the facts that, if two receivers are fairly close to each other (compared to the satellites far away in the space), the satellite signals that reach both of the receivers will have traveled through virtually the same slice of atmosphere, and so will have virtually the same errors. There are numerous satellites "in sight" (GPS satellite constellation is designed such that four or more satellites can be seen simultaneously at any location on the surface of the earth), and the reference receiver has no way of knowing which of the many available satellites a moving receiver might be using to calculate its position, thus the reference receiver runs through all the visible satellites and computes each of their errors. Then it transmits the correction information to the moving receiver. The moving receivers get the complete list of errors and apply the corrections for the satellites they're using. However, DGPS requires one or more stationary receivers. Applicant has recognized that the need for calibrated ground stations or stationary receivers may be substituted out or eliminated by using moving GPS measurements to update a climate model and simultaneously using the climate model to update the moving GPS position measurements.

Figure 5:
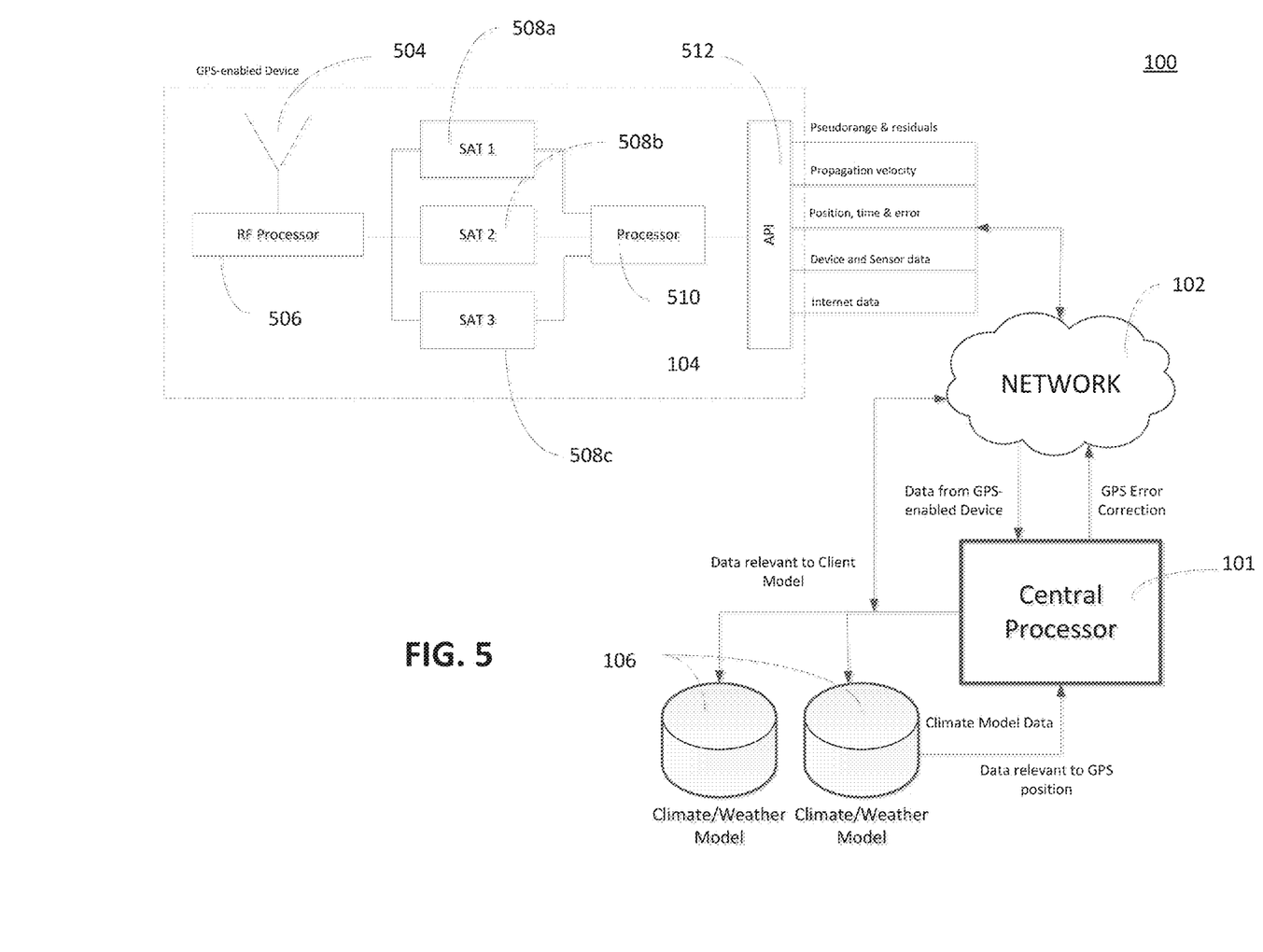
FIG. 5 depicts a more detailed view of the atmospheric modeling and GPS correction system, according to an illustrative embodiment of the disclosure.

FIG. 5 depicts a more detailed view of the atmospheric modeling and GPS correction system 100, according to an illustrative embodiment of the disclosure. Specifically, FIG. 5 depicts the central processor 101 of FIG. 1 connected via a network 102 to a GPS-enabled device 104. The central processor 101 is also connected to one or more processors or databases containing one or more computerized atmospheric climate or weather model 106.

In certain embodiments, an atmospheric model is a mathematical model constructed around the full set of primitive dynamical equations which govern atmospheric motions. The atmosphere may be, for modeling purposes, considered a fluid. As such, the idea of numerical weather prediction is to sample the state of the fluid at a given time and use the equations of fluid dynamics and thermodynamics to estimate the state of the fluid at some time in the future. The model can supplement these equations with parameterizations for turbulent diffusion, radiation, moist processes (clouds and precipitation), heat exchange, soil, vegetation, surface water, the kinematic effects of terrain, and convection. The atmospheric models may be numerical, i.e. they discretize equations of motion. They can be used to predict microscale phenomena such as tornadoes and boundary layer eddies, sub-microscale turbulent flow over buildings, as well as synoptic and global flows. The horizontal domain of a model is either global, covering the entire Earth, or regional (limited-area), covering only part of the Earth. The different types of models include thermotropic, barotropic, hydrostatic, and nonhydrostatic. Different models use different solution methods. Global models often use spectral methods for the horizontal dimensions and finite-difference methods for the vertical dimension, while regional models usually use finite-difference methods in all three dimensions. For specific locations, model output statistics use climate information, output from numerical weather prediction, and current surface weather observations to develop statistical relationships which account for model bias and resolution issues.

The atmospheric models described herein may include any suitable global or regional atmospheric or climate model without departing from the scope of the present disclosure. For example, the atmospheric models may include Global Forecast System (GFS, previously AVN) developed by NOAA, NOGAPS developed by the US Navy, Global Environmental Multiscale Model (GEM) developed by the Meteorological Service of Canada (MSC), IFS developed by the European Centre for Medium-Range Weather Forecasts, Unified Model (UM) developed by the UK Met Office, GME developed by the German Weather Service, ARPEGE developed by the French Weather Service, Météo-France, and the Intermediate General Circulation Model (IGCM). The models 106a and/or 106b may include suitable climate models or other suitable quantitative methods to simulate the interactions of the atmosphere, oceans, land surface, and ice. These models may be used for a variety of purposes from study of the dynamics of the climate system to projections of future climate.

The GPS-enabled device 104 may include a number of components for receiving and processing GPS signals, determining position values and transmitting these values to the central processor 101 and/or the atmospheric model 106. In certain embodiments, the GPS-enabled devices may be moving and as such may include suitable navigation processors for resolving its position and velocity. Specifically, the GPS-enabled device 104 includes a radio frequency (RF) antenna 504 for receiving GPS signals from the GPS satellites, and an RF processor 506 for pre-processing the received signals. FIG. 5 depicts three separate tracking loops 508a, 508b, and 508c (although there may be more or less) for each satellite channel. The tracking loops may be scalar or vector loops and may be used to estimate the pseudo-ranges and pseudo-range rates for each of the available satellites. In certain embodiments, the tracking loops may include delay lock loop (DLL), frequency lock loop (FLL), and/or a phase lock loop. The pseudo-ranges and pseudo-range rates are fed forward to the navigation processor, which may then solve for receiver's position, velocity, clock bias and clock drift. The navigation processor may include an iterative least squares technique or a Kalman filter.

Advantageously, the GPS-enabled device 104 may include an application protocol interface (API) 512 for transmitting data from the device 104 to the central processor 101. API may allow the device 104 to send pseudo-range values, pseudo-range rates, related residuals, propagation velocity determinations, and position and error determinations made by processor 510. In certain embodiments, the device 104 may include or be included within a mobile electronic device 104a such as a smartphone. Such mobile devices may have additional capabilities including temperature sensors, humidity sensors, altitude sensors, pressure sensors and cameras for observing and measuring terrestrial environmental conditions. The API 512 may allow such sensor data to be made available to the central processor 101. In certain embodiments, the device 104 may be included with one or more buoys 104b. The buoys 104b may include one or more atmospheric and ocean sensors for collecting environmental data from the earth's water bodies. The API 512 may allow such sensor data to be made available to the central processor 101. In certain embodiments, the device 104 may be included within an aircraft. The Aircraft may be equipped with sensors for measuring atmospheric conditions over land and sea. The API 512 may allow such sensor data to be made available to the central processor 101. Generally, the GPS-enabled device 104 may have access to any suitable data, which it then may make available, using the API 512, to the central processor 101. The device 104 may also be connected to the Internet and may have access to information available generally on the world wide web, and to other devices 104. The API 512 may be configured to share information with other devices 104 and with the central processor 101.

Figure 6:
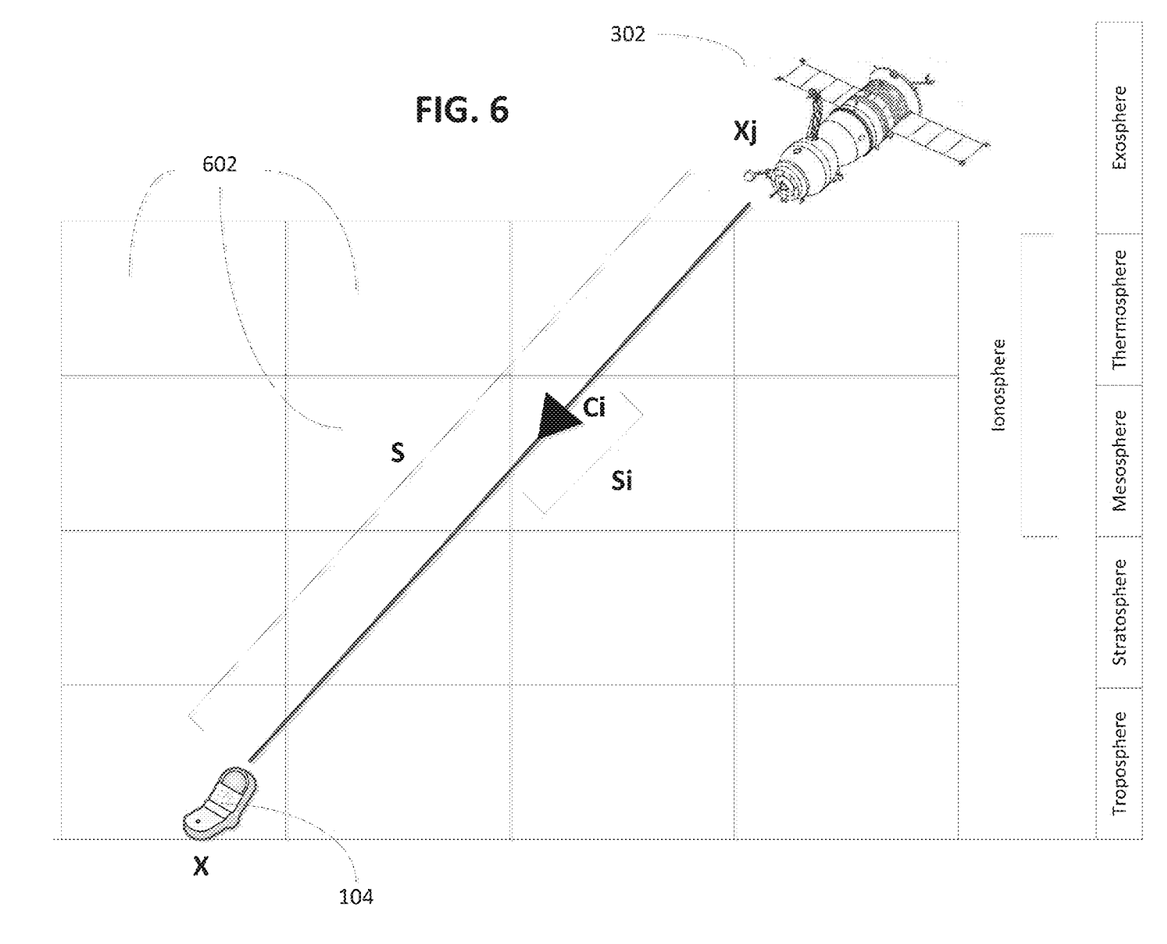
FIG. 6 depicts certain technical parameters used by the systems and methods described herein when determining atmospheric and GPS parameters, according to an illustrative embodiment of the disclosure.

The central processor 101 may the use the data obtained from the one or more GPS-enabled devices 104 to update a climate model. The central processor 101 also uses estimates from the climate model, in return, to update position error values. In certain embodiments in which the GPS-enabled device may be in motion, the central processor 101 may include a motion model, which may be updated simultaneously with the atmospheric climate model and the position error values. FIG. 6 depicts certain technical parameters used by the central processor 101 when determining atmospheric and GPS parameters, according to an illustrative embodiment of the disclosure.

The distance from the satellite 302 to a GPS-enabled device 104 may be:

$$s = |x_j - x| \quad (1)$$

Where, $X_j$ is the GPS satellite position and the X is the GPS receiver position. The propagation time for a radio signal from the satellite to the receiver may be a function of the distance, the propagation speed, and the velocity of the fluid in the direction of propagation.

$$\tau = s/(c - u \cdot n) \quad (2)$$

Where τ is the propagation time, c is the propagation speed of the radio waves in stationary fluid, u is the velocity vector and n is the unit normal vector to the satellite. As shown in FIG. 6, the atmosphere may be divided into voxels or volume pixels 602. Generally, the atmospheric properties and corresponding electromagnetic properties of a voxel 602 may be assumed to be constant. Accordingly, for multiple voxels 602:

$$\tau = \sum_i \frac{s_i}{c_i - \vec{u}_i \cdot \hat{n}} \quad (3)$$

Where $s_i$ is the distance the signal passes through the $i^{th}$ voxel, and $c_i$ is the propagation speed of radio signals in the $i^{th}$ voxel. Now, accounting for a biased receiver position, equation (3) may be updated as follows:

$$\tau = \sum_i \frac{s_i}{c_i - \vec{u}_i \cdot \hat{n}} - \frac{\Delta \vec{x} \cdot \hat{n}}{c_0} \quad (4)$$

Where $\Delta \vec{x}$ is the GPS receiver position error, $c_0$ is the propagation speed of radio signals in a vacuum. Now, introducing and correcting for receiver timing errors, ε, equation (4) may be updated as follows:

$$\tau = \sum_i \frac{s_i}{c_i - \vec{\mu}_i \cdot \hat{n}} - \frac{\Delta \vec{x} \cdot \hat{n}}{c_0} + \varepsilon \quad (5)$$

Equation (5) may be linearized as follows:

$$\tau = \sum_i \left( \frac{s_i}{c_0} - \frac{s_i \Delta c_i}{c_0^2} + \frac{\vec{u}_i \cdot \hat{n}}{c_0^2} \right) - \frac{\Delta \vec{x} \cdot \hat{n}}{c_0} + \varepsilon \quad (6)$$

Where $\Delta c_i = c_i - c_0$. As seen in equation (6), $c_0$, $s_i$, and $\hat{n}$ are generally known quantities and therefore the central processor 101 may be configured to solve for $\Delta c_i$, $\Delta \vec{x}$ and $\vec{u}_i$. In particular, the central processor 101 may solve for the propagation velocity in the $i^{th}$ voxel and the GPS position error value simultaneously in the same equation. The propagation velocity may then be used to estimate and update one or more atmospheric model parameters. The position error value may be used to correct position values in one or more GPS-enabled devices.

However, to solve for these unknowns, a suitable number of measurements must be obtained such that the number of equations is more than the number of unknowns. Here for each GPS-enabled device 104, there are four degrees of freedom for the GPS position, namely x, y, z, and t. Similarly, for each voxel, there are four degrees of freedom for the propagation velocity within the corresponding voxel, namely u, v, w and c. Applicant has recognized that to solve for millions of voxels representing the atmosphere, the number of devices 104 must also be high. This is because, if there are M devices and N voxels, the number of unknowns are 4M+4N. With M devices and P satellites for Q times, the number of observations may be MPQ.

Accordingly, to solve for both propagation velocity across the millions of voxels:

$$MPQ > 4M + 4N \quad (7)$$

The time Q represents the time to solve the equation (6) and also the time during which the atmosphere must be relatively constant so as to obtain consistent measurements. Accordingly, to solve equation (6) within a reasonable amount of time Q, a large number of GPS-enabled devices 104 will likely be required. For example, for a network of about one million smart phones, each having a GPS receiver, and for solving for an atmospheric volume of a 10,000 km cube (with 10 km voxels) using five satellites and a 1 second sampling rate, the time during which the atmosphere must be constant is about 20 minutes. However, for a larger network of about 10 million devices 104, and fewer number of voxels (atmospheric volume of 10,000 km×10,000 km×1,000 km) and a larger number of satellites (10 satellites), the time to solve equation (6) and during which the atmosphere must be constant is about 10 seconds.

Figure 7:
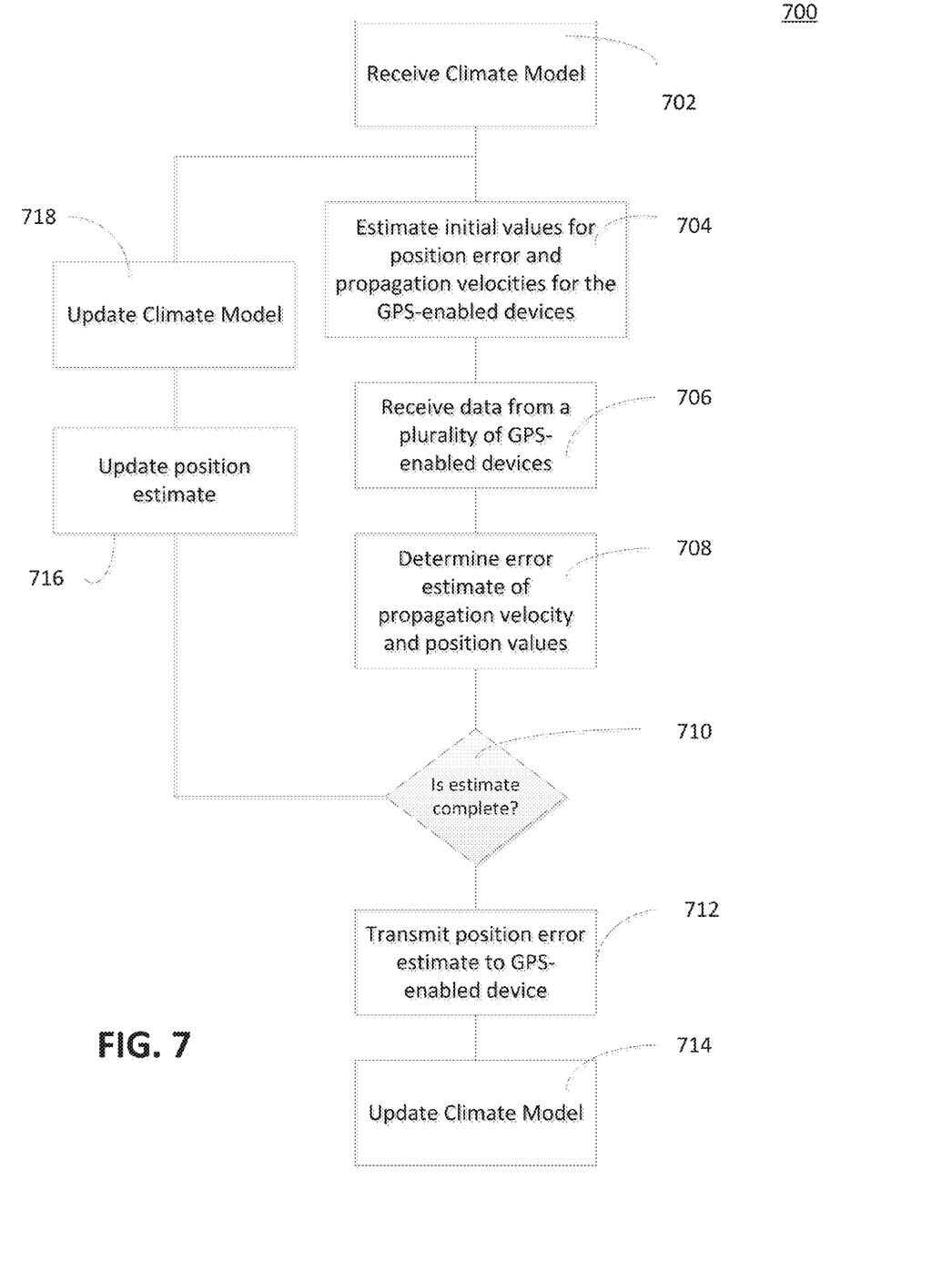
FIG. 7 depicts an illustrative flow diagram of the process of simultaneously performing climate modeling and adjusting for GPS errors.

In certain embodiments, the central processor 101 may solve equation (6) using an estimation technique in which the atmospheric model is estimated and iteratively updated. FIG. 7 depicts an illustrative flow diagram of the process 700 of simultaneously performing climate modeling and adjusting for GPS errors. The process 700 may begin with the central processor 101 receiving a computerized atmospheric model from a model database (step 702). In certain embodiments, the central processor 101 may include a network of parallel processors capable of accessing the model database and one or more atmospheric models. While in certain embodiments, the central processor 101 receives the model from the database through the network 102, in other embodiments the central processor 101 may receive the model via a direct connection with the database(s). In still other embodiments, the central processor 101 may not download the model from the database, but instead log into the model database remotely and access model parameters and perform updates. The central processor 101 may then, using the atmospheric model, estimate values of propagation velocity and the position and error for one or more of a plurality of GPS-enabled devices (step 704). The central processor 101 may maintain a database of GPS-enabled devices, which it may then use for estimating initial values of propagation velocity and GPS position error. The central processor 101 may determine propagation velocity (for one or more voxels) from atmospheric parameters such as temperature, pressure and water vapor content. As noted earlier, these atmospheric parameters influence the refractivity of the atmosphere, which in turn affect time delays of radio signals. The central processor 101 may use the atmospheric parameters to determine initial estimates of propagation velocity and GPS position error based on these refractivity-based calculations. In certain embodiments, the central processor 101 may not have a complete atmospheric model with accurate values for all its parameters. In such embodiments, the central processor 101 may receive a partial computerized model from the model database. The central processor 101 may still be able to estimate initial values for the propagation velocity and GPS position error based on refractivity-based calculations from these one or more partial atmospheric models.

The central processor 101 may receive data from one or more GPS-enabled devices (step 706). As noted earlier, a very large number of GPS-enabled devices may be configured to connect to a network and transmit data including propagation velocity, position, pseudo-ranges, pseudo-range rates, sensor data and Internet-based data. The central processor 101 may be configured to receive and collect such data from the plurality of GPS-enabled devices. In certain embodiments, the central processor 101 may collect data from over a million devices and in some cases over 10 million devices. In certain embodiments, the central processor 101 may not receive a complete dataset from the plurality of GPS-enabled device. In such embodiments, the central processor 101 may receive substantially complete data from one GPS-enabled device, while receiving partial information from the remaining plurality of the GPS-enabled devices. In certain information the central processor 101 may receive data synchronously from these GPS-enabled devices at regular intervals. In such embodiments, the data from one or more of these GPS-enabled devices may be sent simultaneously and synchronously. In other embodiments, the central processor 101 may receiver data asynchronously from the plurality of GPS-enabled devices. In such embodiments, the GPS-enabled device may include a navigation system in which velocity information may be calculated at a different time from when the GPS measurement arrives. Accordingly, data from one or more GPS-enabled devices may be sent asynchronously, as they arrive, from the GPS-enabled device to the central processor 101. In certain embodiments, data from one or more GPS-enabled devices may arrive at the central processor 101 at different times and asynchronously with data from another one or more GPS-enabled devices. In certain embodiments, one or more GPS-enabled devices may transmit data at its leisure to the central processor 101. In such embodiments, the central processor 101 may wait to receive a plurality of data from these GPS-enabled devices before processing the data or using the data to update the atmospheric model. Generally, one or more pieces, channels and/or types of data from one or more GPS-enabled devices may be sent together or separately, without departing from the scope of the present disclosure. The central processor 101 may be configured with circuitry to calculate an error estimate of the propagation velocity and GPS position estimates (step 708). The central processor 101 may calculate the error estimate by comparing the propagation velocity and position values estimated based on the climate model with the values obtained from the GPS-enabled devices.

The central processor 101 may then determine if the estimation process is complete (step 710). In one embodiment, the central processor 101 may decide if the estimation process 700 is complete when the error value is below a predetermined threshold. If the process is not complete, the central processor 101 may then use the error estimate to update both the climate model and the GPS position error estimate (steps 716 and 718). The updated climate model may then be used to estimate a new value for propagation velocity and position, which then may be used to iterate through the estimation process. Once the process is complete, the central processor 101 may transmit the position error estimates back to each of the plurality of GPS-enabled devices (step 712) and update the atmospheric model (step 714). The process 700 may be iterated and repeated any suitable number of times as desired without departing from the scope of the present disclosure.

Variations, modifications, and other implementations of what is described may be employed without departing from the spirit and scope of the systems and methods described herein. For example, though the systems and methods are described in the context of atmospheric modeling using GPS measurements, the systems and methods may be equally applicable for modeling atmospheric parameters using radar, optical signal, and any acoustic or electromagnetic signal measurements. The systems and method described herein may be applicable to underwater beacon networks. Moreover, any of the method and system features described above or incorporated by reference may be combined with any other suitable method or system feature disclosed herein or incorporated by reference, and is within the scope of the contemplated systems and methods. The systems and methods may be embodied in other specific forms without departing from the spirit or essential characteristics thereof. The foregoing embodiments are therefore to be considered in all respects illustrative, rather than limiting of the systems and methods described herein.

The invention claimed is:

1. A computerized method for modeling atmospheric properties, comprising:
    receiving, at a central processor, data from a plurality of Global Positioning System (GPS)-enabled devices;
    determining, based at least in part from the data from the plurality of GPS-enabled devices, water vapor content;
    receiving, at a central processor, access to one or more computer-based atmospheric models representative of atmospheric parameters including water vapor content;
    calculating, based at least in part on the determined water vapor content, a propagation delay associated with the water vapor content; and
    simultaneously estimating, at the central processor, a propagation velocity of one or more signals received at each of the GPS-enabled devices from one or more GPS satellites, and a position error value for each of the GPS-enabled devices;
    wherein the central processor simultaneously estimates the propagation velocity and the position error value by iteratively updating the one or more atmospheric models based on the determined water vapor content and correcting for the calculated propagation delay at each of the plurality of GPS-enabled devices.

2. The method of claim 1, wherein the plurality of GPS-enabled devices includes at least one million GPS-enabled devices.

3. The method of claim 1, wherein the central processor simultaneously estimates one or more propagation velocities across an atmospheric volume of at least $10^{11}$ km$^3$.

4. The method of claim 3, wherein the atmospheric volume is divided up into 10 km voxels and the central processor simultaneously estimates propagation velocities within each of the voxels.

5. The method of claim 1, wherein the central processor simultaneously estimates one or more propagation velocities across an atmospheric volume covering an area of $10^4$ km$^2$ and a vertical distance of 1000 km.

6. The method of claim 1, wherein the atmospheric volume is divided up into a plurality of voxels and the central processor simultaneously estimates propagation velocities within each of the voxels.

7. The method of claim 1, wherein the data received from the plurality of GPS-enabled devices include at least one of pseudo-range values, pseudo-range residuals, pseudo-range rates, position value, and position error value.

8. The method of claim 1, wherein the central processor includes at least one of a Kalman filter and a sparse information filter for simultaneously estimating the propagation velocity and the position error value.

9. The method of claim 1, further comprising transmitting the estimated position error value to the plurality of GPS-enabled devices.

\* \* \* \* \*